US010579020B2

(12) United States Patent
Di Domenico et al.

(10) Patent No.: US 10,579,020 B2
(45) Date of Patent: Mar. 3, 2020

(54) FLEXIBLE STRIP FOR HOROLOGY AND METHOD FOR MANUFACTURING THE SAME

(71) Applicant: The Swatch Group Research and Development Ltd, Marin (CH)

(72) Inventors: Gianni Di Domenico, Neuchatel (CH); Jerome Favre, Neuchatel (CH); Dominique Lechot, Les Reussilles (CH); Baptiste Hinaux, Lausanne (CH); Olivier Matthey, Grandson (CH); Pierre Cusin, Villars-Burquin (CH); Alex Gandelhman, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 116 days.

(21) Appl. No.: 15/819,613

(22) Filed: Nov. 21, 2017

(65) Prior Publication Data

US 2018/0143591 A1    May 24, 2018

(30) Foreign Application Priority Data

Nov. 23, 2016    (EP) .................................... 16200182

(51) Int. Cl.
   *G04B 31/004*    (2006.01)
   *G04B 17/04*    (2006.01)
   (Continued)

(52) U.S. Cl.
   CPC ........ *G04B 31/004* (2013.01); *B81C 1/00198* (2013.01); *B81C 1/00603* (2013.01);
   (Continued)

(58) Field of Classification Search
   CPC .. G04B 31/004; G04B 13/026; G04B 17/045; G04B 17/26; G04B 17/32; G04B 31/02;
   (Continued)

(56) References Cited

U.S. PATENT DOCUMENTS

| 2015/0234354 A1 | 8/2015 | Henein et al. | |
| 2016/0327908 A1* | 11/2016 | Winkler | .................. G04C 5/005 |
| 2019/0243308 A1* | 8/2019 | Winkler | .................. G04B 15/08 |

FOREIGN PATENT DOCUMENTS

| CH | 709 291 A2 | 8/2015 | |
| CH | 712068 A2 * | 7/2017 | ............. G04B 15/14 |

(Continued)

OTHER PUBLICATIONS

European Search Report dated May 17, 2017 in European Application 16200182.0, filed on Nov. 23, 2016 (with English Translation of Categories of cited documents).

(Continued)

*Primary Examiner* — Edwin A. Leon
(74) *Attorney, Agent, or Firm* — Oblon, McClelland, Maier & Neustadt, L.L.P.

(57) ABSTRACT

A method for manufacturing a flexible strip, including forming a plate of the required thickness with one or more micromachinable substrate wafers; affixing, on either side of the plate, an upper mask with an upper window and a lower mask with a lower window, of identical geometry; etching the plate, at least to mid-thickness, from the upper side of each upper etching window, and from the side of each lower etching window; removing the upper mask and the lower mask, to delimit a flexible strip having a height equal to the thickness of the plate, and whose edges are as-etched. A flexible strip made of micromachinable material, including, between two parallel upper and lower surfaces, two periph- (Continued)

eral, tapered and reverse-tapered edge surfaces, for a flexible pivot, a resonator, a movement or a watch.

20 Claims, 4 Drawing Sheets

(51) Int. Cl.
*B81C 1/00* (2006.01)
*G04B 13/02* (2006.01)
*G04B 17/26* (2006.01)
*G04B 17/32* (2006.01)
*G04B 31/02* (2006.01)

(52) U.S. Cl.
CPC ......... *G04B 13/026* (2013.01); *G04B 17/045* (2013.01); *G04B 17/26* (2013.01); *G04B 17/32* (2013.01); *G04B 31/02* (2013.01); *B81B 2203/0163* (2013.01)

(58) Field of Classification Search
CPC ............ G04B 17/10; B81B 2203/0163; B81C 1/00198
USPC ......................................................... 368/168
See application file for complete search history.

(56) References Cited

FOREIGN PATENT DOCUMENTS

EP 3001257 A1 * 3/2016 ............. G04B 17/04
JP 2016-133494 7/2016

OTHER PUBLICATIONS

T. Takano, et al. "Measurements of silicon dry-etching rates and profiles in MEMS foundries and their applications to MEMS design software." SPIE—International Society for Optical Engineering. Proceedings, vol. 6800, XP055372524, 2007, 8 pages.

* cited by examiner

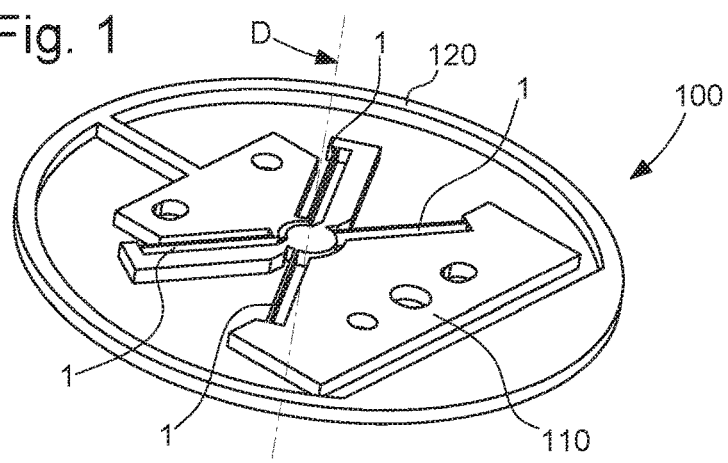
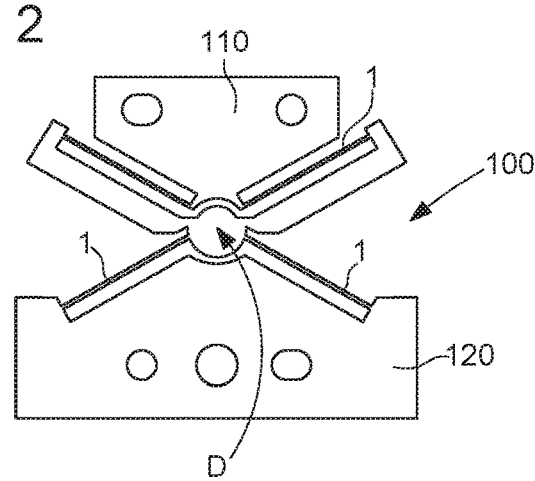
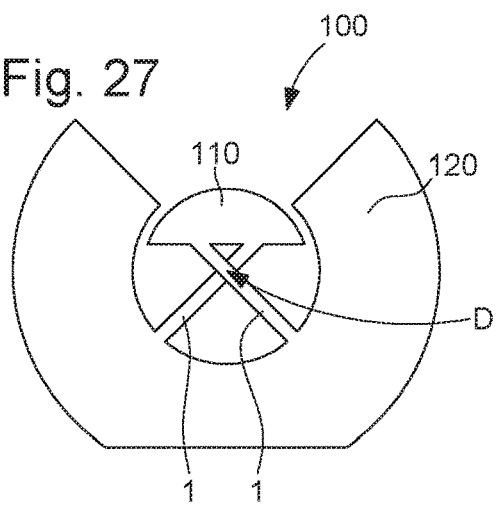
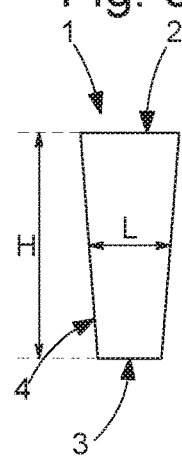
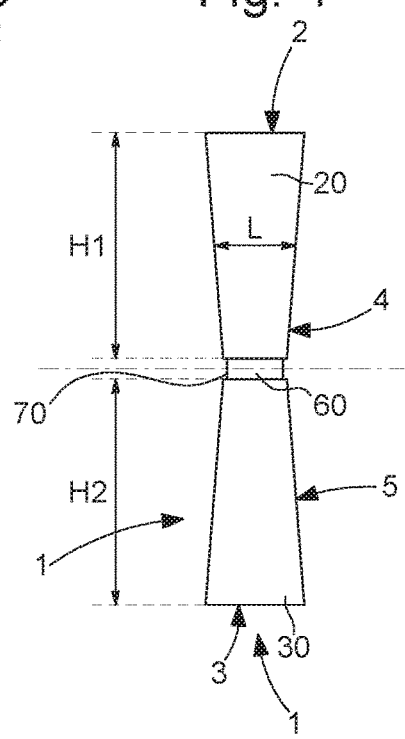
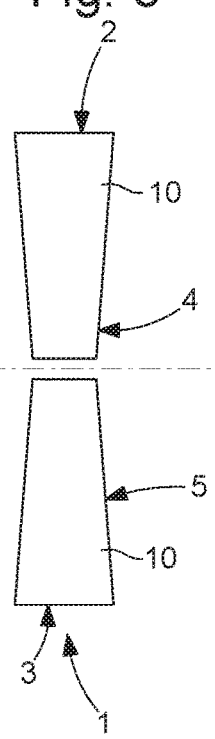
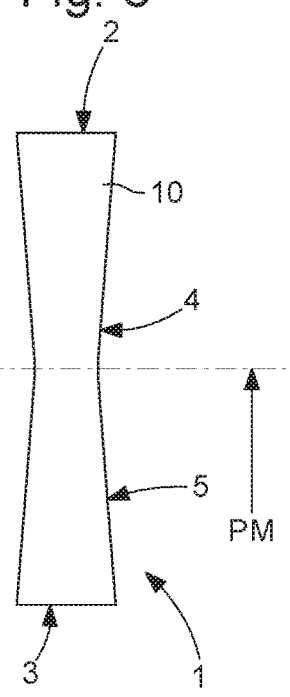

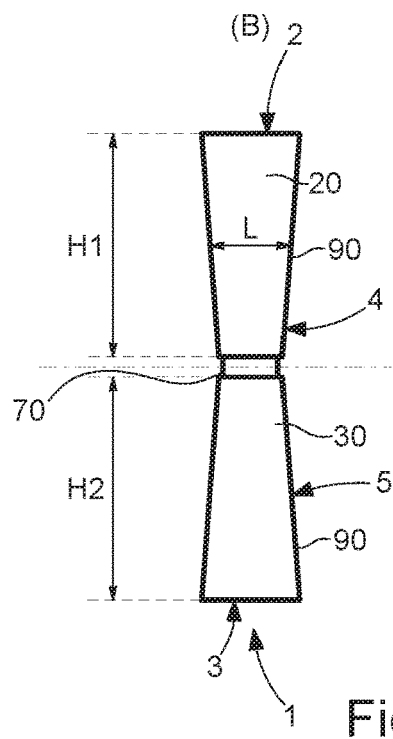
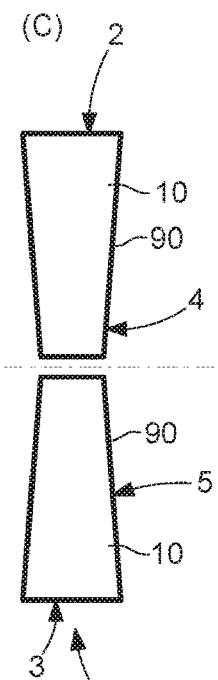
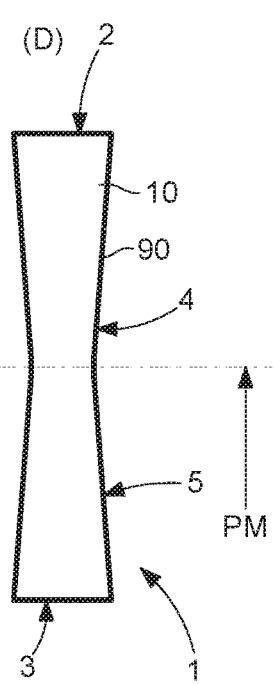
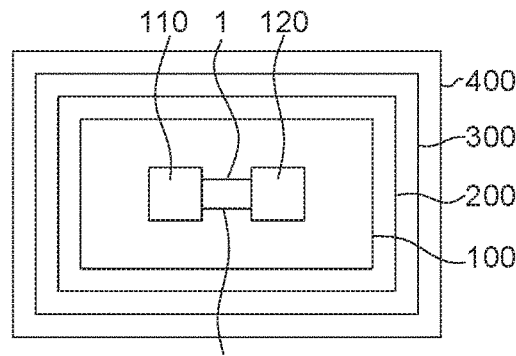
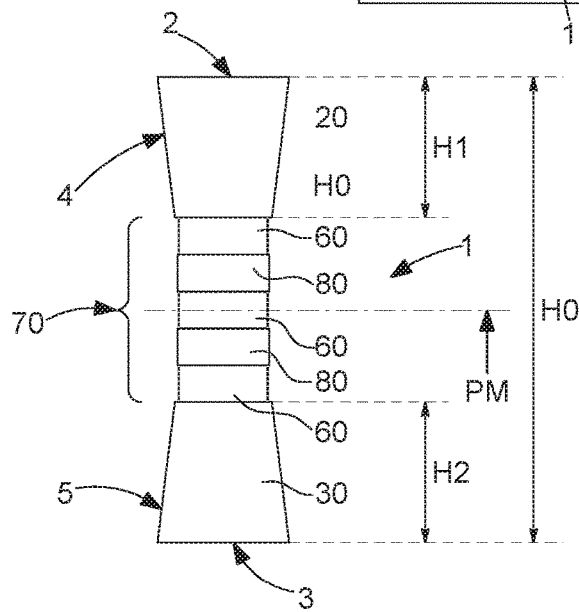
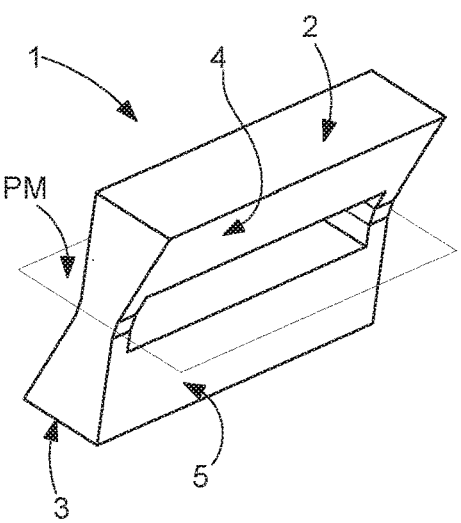

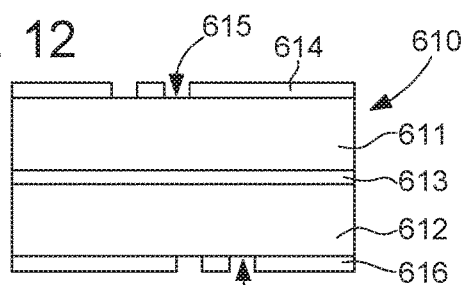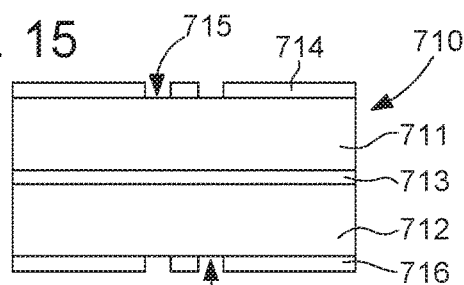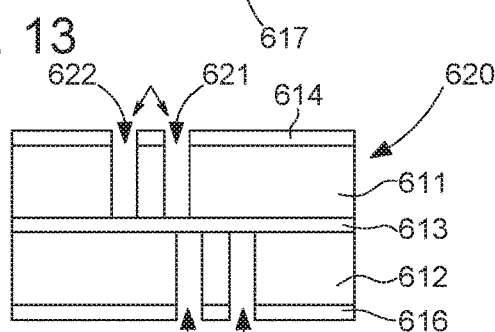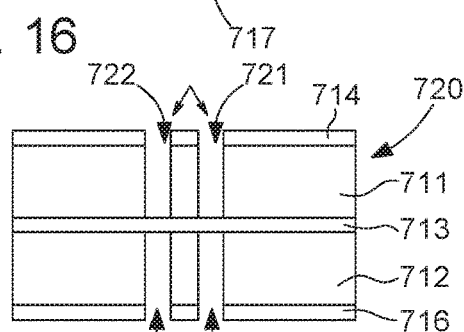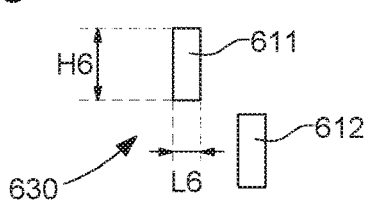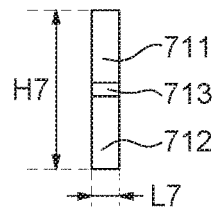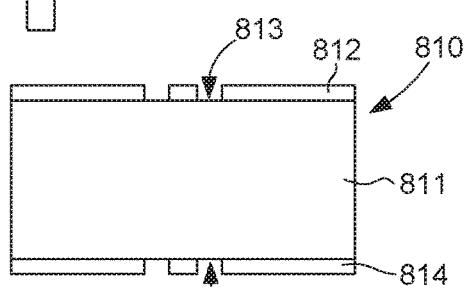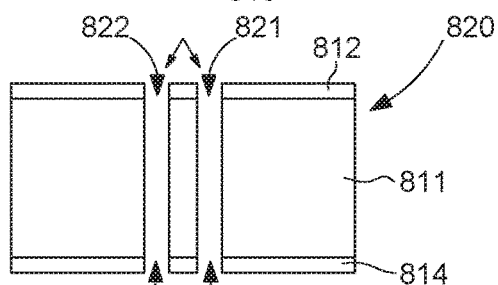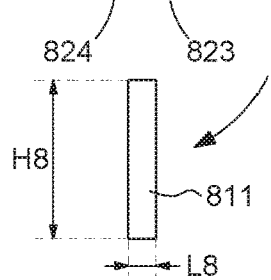

FLEXIBLE STRIP FOR HOROLOGY AND METHOD FOR MANUFACTURING THE SAME

This application claims priority from European Patent Application No. 16200182.0 filed on Nov. 23, 2016, the entire disclosure of which is hereby incorporated herein by reference.

FIELD OF THE INVENTION

The invention concerns a method for manufacturing at least one straight flexible strip for horology made of micromachinable material, comprising parallel upper and lower surfaces, including at least the steps consisting of:
- taking at least one substrate wafer made of micromachinable material, comprising an upper face and a lower face which are parallel;
- forming a plate of the required thickness with a single said substrate wafer or by joining a plurality of said substrate wafers;
- affixing a first, upper mask including at least one upper window to the upper face of said plate, and a second, lower mask comprising at least one lower window to the lower face of said plate;
- etching said plate, to a lower etching depth than said required thickness, tapered from an upper side at each said upper window, and reverse-tapered from a lower side at each said lower window;
- removing said first, upper mask and said second, lower mask.

The invention also concerns a flexible strip for horology made of micromachinable material, comprising an upper surface and a lower surface which are parallel, and, adjacent to said upper surface, a first peripheral edge surface tapered with respect to said upper surface, over a first height.

The invention also concerns a flexible pivot comprising a plurality of such flexible strips.

The invention also concerns a timepiece resonator comprising at least one such flexible pivot.

The invention also concerns a timepiece movement including at least one such resonator, and/or at least one such flexible pivot.

The invention also concerns a watch including at least one such resonator and/or at least one such flexible pivot.

The invention concerns the field of timepiece mechanisms incorporating flexible elastic strips, for guiding and/or elastic return functions, and more particularly flexible pivot devices, and resonators.

BACKGROUND OF THE INVENTION

It is possible to produce an isochronous resonator, for horology, which is independent of position and has a very high quality factor, by combining a pivot having flexible strips with an inertial element, for example a balance.

When such a pivot with flexible strips is made of silicon, the aspect ratio is limited by etching techniques.

The use of a flexible pivot bearing makes it possible replace the conventional contact pivot of a balance, and the elastically returned balance spring. This has the advantage of removing pivot friction, which allows the quality factor of the resonator to be significantly increased. However, flexible pivot bearings are known to:
- exhibit parasitic motion of the instantaneous axis of rotation which makes the operation of the resonator sensitive to its position in the gravitational field;
- have a non-linear elastic return torque, which makes the resonator anisochronous, i.e. the frequency depends on the amplitude of oscillation;
- have a low maximum angular excursion (on the order of 15 to 20 degrees);
- have low impact resistance.

EP Patent Application 2911012 A1 in the name of CSEM describes such a crossed strip flexible pivot, applying the principle stated by W. H. Wittrick, in Aeronautical Quarterly II (1951), wherein the crossing point of the strips is positioned at ⅛th (or ⅞ths) of the length of the strips which notably reduces the effect of positions.

European Patent Application EP14199039.0 in the name of The Swatch Group Research & Development Ltd also describes a resonator with two crossed strips, of the Wittrick pivot type, located in parallel planes and whose crossing point, in projection onto one of these planes, corresponds to the axis of pivoting of the inertial element. This resonator has a specific angle of 72° between the two strips, which optimises the linearity of the elastic return force, and consequently makes the resonator isochronous in a given range of angular amplitude, assuming that it is made of a perfectly elastic material, in other words whose stress depends perfectly linearly on deformation. This particular arrangement makes it possible to optimise the linearity of the elastic return force, and consequently to simultaneously resolve the problem of sensitivity to positions and of anisochronism.

European Patent Application EP16155039.7 in the name of The Swatch Group Research & Development Ltd describes a 2D flexible pivot bearing, i.e. made in one plane, which can easily be made of single crystal silicon. This material has numerous advantages for making a resonator in horological dimensions, in particular excellent elastic properties, precise shaping via photolithography technology, and the possibility of temperature compensation by means of an oxidation layer. Silicon has the drawback, however, of being brittle and therefore sensitive to shocks. This document proposes a different geometry, which makes the resonator simultaneously isochronous and independent of positions, but which has the advantage of being able to be made in a single silicon layer since all the strips are in the same plane.

JP Patent Application 2016133494A in the name of CITIZEN HOLDINGS CO LTD describes a method for manufacturing a double-height spring.

CH Patent Application 709291A2 in the name of CSEM describes an arrangement of crossed flexible strips, of the Wittrick type, with two flexible strips connecting a support element to a balance, capable of exerting a return torque on the balance, wherein a first strip is disposed in a first plane perpendicular to the plane of the oscillator, and a second strip is disposed in a second plane perpendicular to the plane of the oscillator and secant with the first plane, wherein the geometric axis of oscillation of the oscillator is defined by the intersection of the first plane and the second plane, this geometric axis of oscillation crossing the first and second strips at ⅞ths of their respective length.

SUMMARY OF THE INVENTION

To simultaneously solve the drawbacks of known flexible pivots with strips made of micromachinable material, typically silicon or similar, the invention proposes to increase the aspect ratio of the flexible strips, at least by a multiplicative factor of two so as to:
- increase the maximum angular excursion of the pivot;
- increase the shock resistance of the pivot;

improve the out-of-plane stiffness of the pivot, particularly in the direction of the axis of pivoting.

The flexible strip pivots used in timepiece resonators have the advantage of being made of a material whose thermal coefficient of Young's modulus can be adjusted, for example silicon and quartz.

In the case of silicon, deep etch machining techniques allow strips to be obtained with an aspect ratio RA which is typically lower than 20, at the maximum 30 (defined as RA=H/L where H is the strip height in the out-of-plane direction, essentially in the direction of the axis of pivoting when the strip is used in a flexible pivot, and L is the mean width of the strip).

In order to optimise the points set out above, it is advantageous to increase this aspect ratio. Indeed, a higher aspect ratio makes it possible:
- to increase the maximum angular travel of the pivot. Indeed, it is well known to those skilled in the art that maximum stress is lowered by manufacturing thinner and higher strips;
- to increase the shock resistance of the pivot. Indeed, a thinner and higher strip will have a higher cross-section for the same bending stiffness. This has the result of increasing the resistance to breakage of the strip with respect to any traction/compression forces that may result from a shock;
- to improve the out-of-plane stiffness of the pivot. Indeed, the ratio between out-of-plane stiffness and in-plane stiffness is proportional to $RA^2$. The improvement in this stiffness may be desirable in some situations where the resonator has to interact with an escapement sensitive to positioning in the axial direction.

To this end, the invention concerns method for manufacturing a straight, flexible strip according to claim 1.

The invention concerns a flexible strip according to claim 1.

The invention concerns a flexible strip according to claim 13.

The invention also concerns a flexible pivot comprising a plurality of such flexible strips.

The invention also concerns a timepiece resonator comprising at least one such flexible pivot.

The invention also concerns a timepiece movement including at least one such resonator, and/or at least one such flexible pivot.

The invention also concerns a watch including at least one such resonator and/or at least one such flexible pivot.

BRIEF DESCRIPTION OF THE DRAWINGS

Other features and advantages of the invention will appear upon reading the following detailed description, with reference to the annexed drawings, in which:

FIG. 1 represents, in a schematic and perspective manner, a timepiece resonator mechanism comprising an inertial element suspended with respect to a fixed structure, by a set of coplanar strips performing both the guiding and pivoting return of the balance about an axis of pivoting on which is aligned the centre of inertia of the inertial element.

FIG. 2 represents a plan view of the central portion of the mechanism of FIG. 1, with the axis of pivoting at the point where the directions of the four strips aligned in pairs cross.

FIG. 3 represents a schematic and cross-sectional view of a prior art strip made of micromachinable material, with a peripheral tapered surface resulting from the etching process.

FIGS. 4 to 10 represent, in a similar manner to FIG. 3, sections of strips made according to the invention:

FIG. 4 illustrates a strip fabricated from a blank formed of two silicon levels separated by an oxide layer (SOI wafers), the etching of the strip being performed from the top for the upper layer, and from the bottom for the lower level.

FIG. 5 is similar to FIG. 4, and concerns a strip whose upper and lower portions are joined in continuous areas, for example at the attachment ends, and with removal of the oxide, so that the flexible portion of the strip is separated into two parts whereas the attachments remain joined.

FIG. 6 concerns a strip obtained by etching a single silicon layer two times thicker than that of FIG. 3, the etch being performed, as in FIGS. 4 and 5, half from the top and half from the bottom.

FIG. 7 illustrates a more complex strip variant, obtained from a complex joining several silicon layers separated by silicon oxide layers.

FIGS. 8 to 10 represent strips similar to those represented respectively in FIGS. 4 to 6, but, in order to reduce the sensitivity of these strips to temperature variations, with a surface silicon oxide layer over the entire periphery of the strips.

FIG. 11 is a perspective view of a strip according to claim 5 or FIG. 9.

FIGS. 12 to 14 illustrate, in a schematic, cross-sectional view of the product in the process of manufacture, three successive steps for manufacturing flexible strips, according to the prior art.

FIGS. 15 to 17 illustrate, in a similar manner to FIGS. 12 to 14, three successive steps for manufacturing flexible strips with a high aspect ratio, in a first variant of the method according to the invention.

FIGS. 18 to 20 illustrate, in a similar manner to FIGS. 15 to 17, three successive steps for manufacturing flexible strips with a high aspect ratio, in a second variant of the method according to the invention.

FIG. 27 is a plan view of a resonator comprising two such strips, disposed in different planes, and whose projections onto one of these planes cross each other at the axis of pivoting of an inertial element, whose centre of inertia is positioned on this axis.

FIG. 28 is a block diagram representing a watch including a timepiece movement comprising such a resonator, in turn comprising a resonator with a flexible pivot comprising strips according to the invention.

DETAILED DESCRIPTION OF PREFERRED EMBODIMENTS

Figure 21:
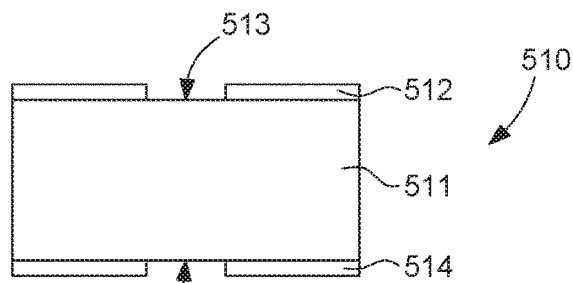
FIGS. 21 to 26 illustrate, in a similar manner to FIGS. 15 to 17, six successive manufacturing steps corresponding to an intermediate process, in a third variant of the method according to the invention, usable in combination with the first variant or the second variant of the method.

The invention concerns the development of flexible strips for timepiece mechanisms, such as pivots, resonators, escapement mechanisms, or suchlike, with improved properties compared to existing flexible strips. In particular, the invention endeavors to obtain elastic flexible strips with a much higher aspect ratio than that of prior art strips.

The flexible strips according to the invention must be usable both in single level structures, and in more complex structures implementing several parallel levels.

FIG. 1 represents a resonator with a single-level flexible pivot, comprising a fixed structure to which is fixed an inertial element via a flexible pivot, comprising such flexible strips.

The invention is described below for a simplified application to a basic strip, especially, but not limited to a straight strip, and the features of the invention are also applicable to a more complex structure, in particular to a one-piece element, particularly made of micromachinable, material, silicon or suchlike.

FIG. 2 shows a detail of the structure of FIG. 1, with such a one-piece element in particular forming a flexible pivot, which may be made on one level since all the strips comprised therein are in the same plane.

FIG. 3 illustrates a flexible strip of the prior art, usable in particular to form such a flexible pivot. This strip is fabricated in one level of micromachinable material, particularly silicon. Usually, this strip 1 extends between two parallel faces, an upper face 2 and a lower face 3, the parallelism of these faces is a consequence of the method of fabricating the raw material used to manufacture the strip, usually a silicon wafer or suchlike. A variant, not illustrated, of the strip according to the invention, may naturally include upper and lower surfaces that are not parallel, or are of different geometry. The inclination of the flanks of strip 1 is peculiar to the current deep etch process and is not shown to scale: indeed, depending on the aspect ratio, the taper angle should be on the order of 1°. The aspect ratio RA=H/L is limited by the etching technique.

The invention consists in creating a flexible strip geometry with, for the same width L, a much greater height H than the current height, and in particular, but not limited to, a silicon wafer with two levels, in order to increase the aspect ratio of the strips by a factor of two, as shown in FIGS. 4 to 10.

It therefore concerns improving such a flexible strip 1 for horology made of micromachinable material, comprising an upper surface 2 and a lower surface 3 which are parallel, and, adjacent to upper surface 2, a first peripheral edge surface 4 tapered with respect to upper surface 2, over a first height H1.

To this end, according to the invention, flexible strip 1 includes, remote from upper surface 2, and adjacent to lower surface 3, a second peripheral edge surface 5 reverse-tapered with respect to first peripheral edge surface 4.

This second peripheral edge surface 5 extends over a height H2; in a particular non-limiting application, H2=H1.

More particularly, as visible in the variants of FIGS. 6 and 10, second peripheral edge surface 5 is adjacent both to first peripheral edge surface 4 and to lower surface 3.

More particularly, as visible in the variants of FIGS. 4, 5, 7, 8, 9, second peripheral edge surface 5 is, at least on one part of flexible strip 1, remote from first peripheral edge surface 4.

According to the invention, as visible in the variants of FIGS. 5, 6, 9, 10, upper surface 2 and lower surface 3 are part of the same single level 10 of micromachinable material.

In an alternative, as visible in the variants of FIGS. 4, 7 and 8, upper surface 2 and lower surface 3 are respectively part of an upper layer 20 and a lower layer 30 which are two different layers of the same first micromachinable material between which extends at least one intermediate layer 60 of a second micromachinable material, different from the first micromachinable material.

More particularly still, as visible in FIGS. 4 and 7, a core 70 made of micromachinable material comprising at least one layer 80 of micromachinable material extends between upper layer 20 and lower layer 30; and at least one intermediate layer 60 of a second different micromachinable material extends at the junction between core 70 and upper layer 20 on the one hand, and between core 70 and lower layer 30 on the other hand. It is thus possible to form a multi-layered strip 1, having a total thickness H0 much greater than the total of H1+H2.

In the particular embodiment of FIG. 4, this core 70 has only one layer 80.

In a particular embodiment, at least one layer 80 is a layer of the first micromachinable material.

In a particular embodiment, the second different micromachinable material is an oxide of the first micromachinable material. In particular, when the first micromachinable material is silicon Si, the second micromachinable material is silicon dioxide $SiO_2$.

In a particular embodiment, illustrated by FIGS. 4 to 10, first peripheral edge surface 4 and second peripheral edge surface 5 are symmetrical with respect to a median plane PM equidistant from upper surface 2 and lower surface 3.

In a particular embodiment, upper surface 2 and lower surface 3 are each part of a layer 10, 20, 30 of the same first micromachinable material which is silicon.

In a particular embodiment, upper surface 2 and lower surface 3 are each part of a layer 10, 20, 30 of the same first micromachinable material which is quartz.

In a particular embodiment, upper surface 2 and lower surface 3 are each part of a layer 10, 20, 30 of the same first micromachinable material which is DLC or sapphire or ruby or diamond.

In a particular embodiment, illustrated by FIGS. 8 to 10, in order to make the mechanism insensitive to temperature variations, which is essential in the case of a resonator, the entire peripheral surface of flexible strip 1 is the surface of a thin layer 90 of an oxide of a micromachinable material which form an upper layer 20 and a lower layer 30 delimited respectively by upper surface 2 and lower surface 3.

The thickness of thin layer 90, particularly a thin temperature compensation oxide layer, must be adapted from case to case. More particularly, in the case where the strips form the elastic return means of a resonator with flexible strips, the thickness of this thin layer 90 is finely adjusted so that the variation in stiffness of the strips with temperature offsets as far as possible the variation in inertia of the resonator with temperature (expansion of the balance). In a particular but non-limiting embodiment, this thickness of the thin layer is less than 5 micrometres, more particularly is comprised between 2.5 and 5.0 micrometres; more particularly still is comprised between 2.5 and 3.0 micrometres.

More particularly, upper surface 2 and lower surface 3 are each part of a layer 10, 20, 30 of the same first micromachinable layer which is silicon, and thin layer 90 is silicon dioxide $SiO_2$.

FIG. 4 illustrates a variant wherein strip 1 is manufactured on two levels of silicon separated by an oxide layer 60, particularly silicon dioxide $SiO_2$. (SOI wafers). The etch is performed from the top from upper surface 2 for the upper level and from the bottom from lower surface 3 for the lower level. This method makes it possible to achieve an aspect ratio that is two times higher. The oxide is not removed, therefore strip 1 forms a single piece.

FIG. 5 is similar to FIG. 4 but with the oxide removed, so that the flexible portion of the strips is separated into two parts, whereas the anchoring points remain attached, as seen in FIG. 11. This variant is advantageous in cases where greater flexibility is desired in the vertical direction.

FIG. 6 illustrates the etch of a single level of silicon two times thicker than strip 1 of FIG. 3 and the etch is performed half from upper surface 2 and half from lower surface 3.

In short, the embodiments of FIGS. 4 to 10 illustrate the implementation of the same method, wherein, from a wafer made of micromachinable material, or of a stack of wafers joined by oxide layers, the etch is performed partly from upper surface 2 and partly from lower surface 3, to increase the aspect ratio of the strip 1 thereby produced compared to the prior art. More particularly, the etch is performed half from upper surface 2 and half from lower surface 3, to double the aspect ratio of the strip 1 thereby produced compared to the prior art.

As already explained above, this method may be implemented both for an individual strip, and for a one-piece element combining several basic components or several functions, and more particularly a complete flexible pivot, or a complete resonator, or other component.

FIGS. 12 to 14 illustrate three successive steps of manufacturing flexible strips according to the prior art, in order to produce, for example, a one-piece flexible pivot as represented in FIG. 27.

FIG. 12 shows a first step 610 of lithography: a first level 611 is joined to a second level 612 by an intermediate layer 613; this assembly is enclosed between a first, upper mask 614 pressed onto first, upper level 611, and comprising upper etching windows 615, and a second, lower mask 616 pressed onto second, lower level 612; and comprising lower etching windows 617; the first, upper mask 614 and second, lower mask 616 are neither identical nor aligned.

FIG. 13 shows a second etching step 620, during which an upper etch, performed through upper etching windows 615, creates upper recesses 621, 622, and a lower etch, made through lower etching windows 617, creates lower recesses 623, 624.

FIG. 14 shows a third step of release, during which masks 614 and 616 are removed, and intermediate layer 613 is destroyed. Two strips are thus obtained, one created in first level 611 and the other in second level 612. In the illustrated example, these strips have an identical cross-section, and a width L6 and a height H6, defining an aspect ratio RA6=H6/L6.

In the example of FIG. 27 considered, the two strips thereby produced are necessarily in two distinct planes since they have identical geometries.

The invention defines a method for improving the operating process to obtain the desired increase in aspect ratio, more particularly for a straight flexible strip.

This method of manufacturing at least one straight flexible strip 1 for horology made of micromachinable material, comprising an upper surface 2 and lower surface 3 which are parallel, includes at least the steps consisting of:

taking at least one substrate wafer made of micromachinable material, including an upper face and a lower face which are parallel;

forming a plate of the required thickness with a single such substrate wafer 511, 811, or by joining a plurality of such substrate wafers 711 and 712;

affixing a first, upper mask 512, 714, 812, including at least one upper window 513, 715, 813, on the upper face of this plate, and a second, lower mask 514, 716, 814, including at least one lower window 515, 717, 815, on the lower face of the plate;

etching the plate, to a lower etch depth than this required thickness, from an upper side at each upper window 513, 715, 813, creating, adjacent to upper surface 2, a first peripheral edge surface 4 tapered with respect to upper surface 2, over a first height H1, and creating, from a lower side at each lower window 515, 717, 815, remote from upper surface 2 and adjacent to lower surface 3, a second peripheral edge surface 5 reverse-tapered with respect to first peripheral edge surface 4;

removing first, upper mask 512, 714, 812, and second, lower mask 514, 716, 814.

According to the invention, this first, upper mask 512, 714, 812 and second, lower mask, respectively 514, 716, 814, are of identical geometry and disposed in symmetry with respect to a median plane located at mid-thickness of the plate.

The sum of the etch depths is greater than or equal to the thickness of the plate, so as to delimit at least one flexible strip 1 whose height H is equal to the thickness of the plate, and whose width L is defined by the profile of first, upper mask 512, 714, 812, and of the second, lower mask, respectively 514, 716, 814. The edges of this flexible strip 1, other than the upper and lower faces, are as-etched.

To produce a monolithic flexible bearing according to the invention described above, the geometry of this flexible bearing must be achievable by etching on a single-level, as is the case of the flexible bearing presented in FIGS. 1 and 2. However, this is not the case of the flexible bearing presented in FIG. 27. This pivot of FIG. 27 cannot therefore be made in a monolithic manner according to the method of the invention. However, it is possible to produce each of the (upper and lower) strips according to the method of the invention and then make the pivot of FIG. 27 by assembling these strips.

In a particular embodiment, the step consisting of forming a plate of the required thickness is achieved by thermal bonding a plurality of substrate wafers 711, 712, and forming an intermediate layer 713, and this intermediate layer 713 is kept, in the at least one manufactured strip 1, either in its entirety, or at least at a junction bridge, as seen in FIG. 11. For example, when the substrate is made of silicon, a suitable heat treatment makes it possible to form an intermediate layer of silicon dioxide $SiO_2$.

In another particular embodiment, the step consisting of forming a plate of the required thickness is achieved by joining a plurality of substrate wafers 711, 712, with the insertion of an intermediate layer 713 added between the pairs of substrate wafers, and intermediate layer 713 is kept in the at least one manufactured flexible strip 1, either in its entirety, or at least at a junction bridge. For example, substrate wafers can be bonded to each other.

In both cases, the complete or local destruction of the intermediate layer is preferably achieved by chemical means, for example with hydrofluoric acid HF in the case of $SiO_2$.

The first variant of the method, detailed below, illustrated in FIGS. 15 to 17, illustrates manufacture with several substrate wafers.

The second variant, detailed below, illustrated in FIGS. 18 to 20, illustrates manufacture with a single substrate wafer.

These first and second variants of the method may advantageously be supplemented by a third variant, illustrated in FIGS. 21 to 26, wherein, in the step consisting of etching the plate, intermediate steps are carried out consisting of:

performing a first, upper etch, through each upper etching window to form a first upper recess 521 therein, substantially at mid-thickness of the plate;

applying a barrier layer 531 onto the first, upper mask, to form a second upper recess 532 on each first upper recess 521;

performing a second, lower etch, through each lower etching window to form a lower recess 541 therein aligned with the corresponding second upper recess 532 and first upper recess 521;

destroying barrier layer 531, prior to removing the first, upper mask and the second, lower mask.

More particularly, this barrier layer 531 is made of parylene with a thickness typically greater than or equal to 10 micrometres. However, a parylene barrier layer with a thickness of less than 10 micrometres may also be envisaged.

In a particular embodiment, the micromachinable material of the substrate is silicon, and, after removing the first, upper mask 512, 714, 812, and the second, lower mask 514, 716, 814, a heat treatment is performed on flexible strip 1 adapted to form a peripheral shell of $SiO_2$ all around strip 1 to render it insensitive to temperature variations, to compensate for variations of inertia and of length caused by thermal expansion. More particularly, this thickness is adjusted so that the variation in stiffness of the strip compensates for the variation in inertia of the inertial element caused by thermal expansion.

These three variants of the method are described in detail below.

FIGS. 15 to 17 illustrate three successive steps for manufacturing flexible strips with a high aspect ratio, in a first variant of the method according to the invention:

FIG. 15 shows a first step 710 of lithography: a first level 711 is joined to a second level 712 by an intermediate layer 713; this assembly is enclosed between a first, upper mask 714 pressed onto first, upper level 711, and comprising upper etching windows 715, and a second, lower mask 716 pressed onto second, lower level 712; and comprising lower etching windows 717; first, upper mask 714 and second, lower mask 716 are identical and aligned here;

FIG. 16 shows a second etching step 720, during which an upper etch, performed through upper etching windows 715, creates upper recesses 721, 722, and a lower etch, performed through lower etching windows 717, creates lower recesses 723, 724, which are aligned with upper recesses 721, 722;

FIG. 17 shows a third step of release, during which masks 714 and 716 are removed, and intermediate layer 613 is kept. A single strip is thus obtained, created both in first level 611, intermediate level 613, and second level 612. This single strip has a width L7 and a height H7, defining an aspect ratio RA7=H7/L7. If one starts, in first step 710 with a similar geometry to first step 610 of the prior art, RA7=2. RA6. Naturally, first level 711 and second level 712, which are illustrated here with an equal basic height, may, for some applications, be of different basic height.

FIGS. 18 to 20 illustrate three successive steps for manufacturing flexible strips with a high aspect ratio, in a second variant of the method according to the invention:

FIG. 18 shows a first step 810 of lithography: a single level 811 is enclosed between a first, upper mask 812 pressed onto its upper face, and comprising upper etching windows 813, and a second, lower mask 814 pressed onto its lower face, and comprising lower etching windows 815; first, upper mask 812 and second, lower mask 814 are identical and aligned here;

FIG. 19 shows a second etching step 820, during which an upper etch, performed through upper etching windows 813, creates upper recesses 821, 822, and a lower etch, performed through lower etching windows 815, creates lower recesses 823, 824, which are aligned with upper recesses 821, 822;

FIG. 20 shows a third step of release 830, during which masks 812 and 814 are removed, and a single strip is thus obtained, made in single level 811. This single strip has a width L8, and a height H8, defining an aspect ratio RA8=H8/L8. If one starts, in first step 710 with a single layer of thickness equivalent to the sum of all the levels of first step 610 of the prior art, RA8=2. RA6.

Figure 22:
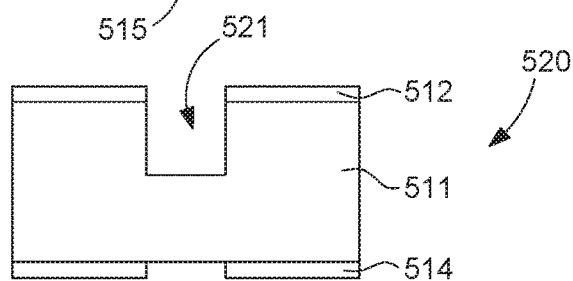
Figure 23:
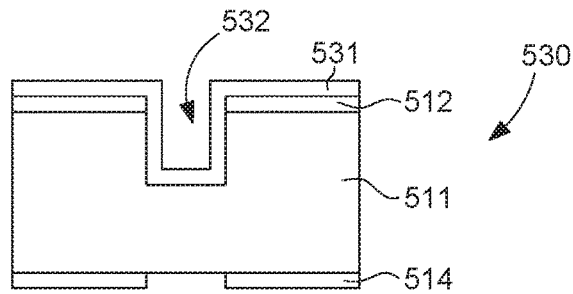
Figure 24:
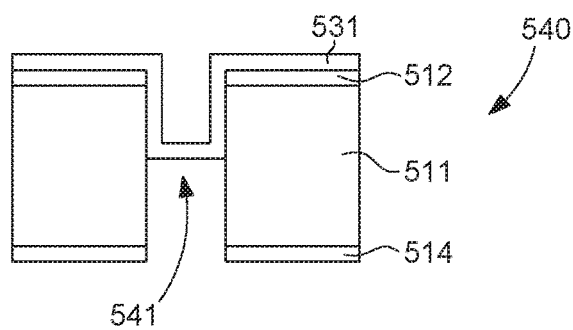
Figure 25:
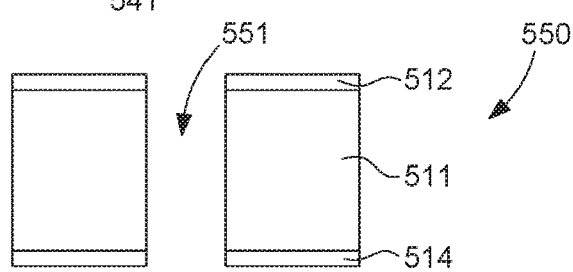
Figure 26:
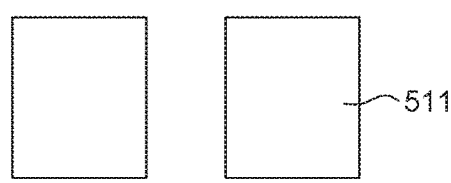

FIGS. 21 to 25 illustrate six successive manufacturing steps corresponding to an intermediate process, in a third variant of the method according to the invention, usable in combination with the first variant or the second variant of the method. These Figures do not specify how the thickness of the strips is achieved—in accordance with the first variant or the second variant—but endeavour to demonstrate a particular method wherein the single etching operation is replaced by a sequence comprising two etching operations separated by a lithography operation, and a first step of release:

FIG. 21 shows a first step 510 of first lithography: a first level 511 is enclosed between a first, upper mask 512 pressed onto its upper face, and comprising upper etching windows 513, and a second, lower mask 514 pressed onto its lower face, and comprising lower etching windows 515; the first, upper mask 512 and second, lower mask 514 are identical and aligned here;

FIG. 22 shows a second step 520 of first etching, during which an upper etch, performed through each upper etching window 513, forms therein a first upper recess 521, substantially at mid-thickness of single level 511;

FIG. 23 shows a third step 530 of second lithography: a barrier layer 531 is applied onto first, upper mask 512, on the opposite side to single level 511, and forms a second upper recess 532 on each first upper recess 521;

FIG. 24 shows a fourth step 540 of second etching, during which a lower etch, performed through each lower etching window 515, forms therein a lower recess 541, which is aligned with the corresponding second upper recess 532 and first upper recess 521;

FIG. 25 shows a fifth step 550 of first release, during which barrier layer 531 is destroyed, before said first, upper mask and second, lower mask are removed in the following step;

FIG. 26 shows a sixth step 550 of second release, during which masks 512 and 514 are removed, to obtain at least one single strip, made in single level 511. Its aspect ratio RA5 depends on the shapes of the masks, according to the first or second method of the invention.

In a particular embodiment, the back sides of the substrates etched in deep etch equipment are cooled, and heat transfer occurs via helium. Consequently, when a transverse etch is performed, as in the case of second etch 820 of the second variant of the method, which includes an upper etch and a lower etch, it is advantageous to first deposit a sealing layer, such as layer 531 of third step 530 of second lithography, in the third variant described above, to prevent the cooling helium passing into the etch plasma, in which case the etch features could be damaged and/or impossible to control.

More particularly, this sealing layer is a parylene layer. In other variants, the sealing layer may be of a different nature, such as an oxide, nitride, metal, thick resin or other layer. This layer is removed once the desired etch is obtained.

In the case of the first variant, more particularly intermediate layer 713 is a buried oxide (BOX) layer. Although the etching stops on this intermediate layer 713 which, in theory, ensures sealing, in practice it is also advantageous to deposit a sealing layer, particularly of parylene, to ensure that there is no leakage, for example if the buried oxide layer breaks. This depends on the parameters and conditions of the second etch. Advantageously, the additional sealing layer is a parylene layer of thickness greater than or equal to 10 micrometres.

In particular, the invention is applicable to resonators with rotational flexible bearings, as illustrated in FIGS. 1 and 27, or to resonators having translational flexible bearings.

The invention is applicable to other etchable elastic materials.

The invention concerns a flexible pivot 100 for horology comprising at least one such flexible strip. More particularly, this flexible pivot 100 for horology includes a plurality of such flexible strips 1. More particularly, these flexible strips 1 together define the axis of pivoting D of flexible pivot 100. More particularly, these flexible strips 1 all have an identical cross-section.

More particularly, in the variant illustrated by FIG. 27, flexible pivot 100 includes at least two flexible strips 1 together defining, in the same plane or in projection onto the same plane when they are parallel and distinct, a crossing point which defines the axis of pivoting D of flexible pivot 100.

More particularly, flexible pivot 100 includes a fixed structure 110 and at least one inertial element 120 connected to each other by flexible strips 1, and the centre of inertia of inertial element 120 is aligned on the axis of pivoting D of flexible pivot 100.

More particularly, flexible strips 1 comprised in this flexible pivot 100 are straight flexible strips.

The invention also concerns a flexible strip resonator 200 for horology comprising such flexible strips 1. More particularly, this resonator 200 includes at least one such flexible pivot 100. More particularly, its flexible strips 1 are arranged to elastically return inertial element 120 to a neutral position.

The invention also concerns a timepiece movement 300 comprising at least one such resonator 200, and/or at least one such flexible pivot 100 and/or including such flexible strips 1.

The invention also concerns a timepiece, particularly a watch 400, including at least one such resonator 200, and/or at least one such flexible pivot 100 and/or comprising such flexible strips 1.

What is claimed is:

1. A flexible strip for horology made of micromachinable material, comprising:
    an upper surface and lower surface which are parallel, and, adjacent to said upper surface, a first peripheral edge surface tapered with respect to said upper surface, over a first height,
    wherein said flexible strip comprises, adjacent to said lower surface, a second peripheral edge surface reverse-tapered with respect to said first peripheral edge surface,
    wherein said upper surface and said lower surface form part of the same single layer of said micromachinable material.

2. The flexible strip according to claim 1, wherein said second peripheral edge surface is adjacent both to said first peripheral edge surface and to said lower surface.

3. The flexible strip according to claim 1, wherein said second peripheral edge surface is, at least on one part of said flexible strip, spaced apart from said first peripheral edge surface.

4. The flexible strip according to claim 1, wherein said first peripheral edge surface and said second peripheral edge surface are symmetrical with respect to a median plane equidistant from said upper surface and from said lower surface.

5. The flexible strip according to claim 1, wherein said same single layer of said micromachinable material is silicon or quartz or DLC or sapphire or ruby or diamond.

6. The flexible strip according to claim 1, wherein the entire peripheral surface of said flexible strip is the surface of a thin layer of an oxide of a micromachinable material of which are formed an upper layer and a lower layer respectively delimited by said upper surface and said lower surface, and wherein said thin layer has a thickness of less than 5.0 micrometres.

7. A flexible strip for horology, made of micromachinable material, comprising:
    an upper surface and a lower surface which are parallel, and, adjacent to said upper surface, a first peripheral edge surface tapered with respect to said upper surface, over a first height H1,
    wherein said flexible strip includes, adjacent to said lower surface, a second peripheral edge surface reverse-tapered with respect to said first peripheral edge surface,
    wherein said upper surface and said lower surface are respectively part of an upper layer and a lower layer which are two different layers of the same first micromachinable material between which extends at least one intermediate layer of a second micromachinable material, different from said first micromachinable material, or of an oxide of said first micromachinable material,
    wherein, between said upper layer and said lower layer, extends a core made of micromachinable material comprising at least one layer made of micromachinable material or formed of said first micromachinable material, and
    wherein, at a junction between said core and said upper layer and between said core and said lower layer extends at least one said intermediate layer of a second said different micromachinable material.

8. The flexible strip according to claim 7, wherein said first peripheral edge surface and said second peripheral edge surface are symmetrical with respect to a median plane equidistant from said upper surface and from said lower surface.

9. The flexible strip according to claim 7, wherein said upper surface and said lower surface are each part of a layer of the same first micromachinable material which is silicon or quartz or DLC or sapphire or ruby or diamond.

10. The flexible strip according to claim 7, wherein the entire peripheral surface of said flexible strip is the surface of a thin layer of an oxide of a micromachinable material of which are formed an upper layer and a lower layer respectively delimited by said upper surface and said lower surface, and wherein said thin layer has a thickness of less than 5.0 micrometres.

11. The flexible pivot for horology comprising a plurality of flexible strips according to claim 1, wherein said flexible strips together define the axis of pivoting of said flexible pivot.

12. The flexible pivot for horology comprising a plurality of flexible strips according to claim 7, wherein said flexible strips together define the axis of pivoting of said flexible pivot.

13. The flexible pivot according to claim 11, wherein said flexible strips all have an identical cross-section.

14. The flexible pivot according to claim 11, wherein said flexible pivot includes at least two flexible strips together defining, in the same plane or in projection onto the same plane when said strips are parallel and distinct, a crossing point which defines said axis of pivoting of said flexible pivot.

15. The flexible pivot according to claim 11, wherein said flexible pivot includes a fixed structure and at least one inertial element connected to each other by said flexible strips, and wherein the centre of inertia of said inertial element is aligned on the axis of pivoting of said flexible pivot.

16. The flexible pivot according to claim 11, wherein said flexible strips comprised in said flexible pivot are straight flexible strips.

17. A timepiece resonator comprising at least one flexible pivot according to claim 11, wherein said flexible pivot includes a fixed structure and at least one inertial element connected to each other by said flexible strips, and wherein the centre of inertia of said inertial element is aligned on the axis of pivoting of said flexible pivot, and wherein said flexible strips are arranged to elastically return said inertial element to a neutral position.

18. The timepiece resonator comprising at least one flexible pivot according to claim 12, wherein said flexible pivot includes a fixed structure and at least one inertial element connected to each other by said flexible strips, and wherein the centre of inertia of said inertial element is aligned on the axis of pivoting of said flexible pivot, and wherein said flexible strips are arranged to elastically return said inertial element to a neutral position.

19. The timepiece movement including at least one resonator according to claim 17.

20. A watch comprising at least one resonator according to claim 17.

\* \* \* \* \*